United States Patent
Tunks et al.

(10) Patent No.: US 11,937,396 B2
(45) Date of Patent: Mar. 19, 2024

(54) HEATER APPARATUS-INTEGRATED TOP COVER FOR A COMPUTING DEVICE

(71) Applicant: Dell Products L.P., Round Rock, TX (US)

(72) Inventors: Eric Michael Tunks, Austin, TX (US); Ayedin Nikazm, Austin, TX (US); Joseph Andrew Vivio, Seattle, WA (US)

(73) Assignee: Dell Products L.P., Round Rock, TX (US)

( * ) Notice: Subject to any disclaimer, the term of this patent is extended or adjusted under 35 U.S.C. 154(b) by 10 days.

(21) Appl. No.: 17/576,713

(22) Filed: Jan. 14, 2022

(65) Prior Publication Data
US 2023/0232566 A1  Jul. 20, 2023

(51) Int. Cl.
*H05K 7/20* (2006.01)
*H05K 5/02* (2006.01)
*H05K 5/03* (2006.01)

(52) U.S. Cl.
CPC ............. *H05K 7/20* (2013.01); *H05K 5/0213* (2013.01); *H05K 5/0247* (2013.01); *H05K 5/03* (2013.01)

(58) Field of Classification Search
CPC ...... H05K 7/20; H05K 5/0213; H05K 5/0247; H05K 5/03
See application file for complete search history.

(56) References Cited

U.S. PATENT DOCUMENTS

| | | | | |
|---|---|---|---|---|
| 8,547,123 B2 * | 10/2013 | Merrow | | G11B 5/5565 361/728 |
| 8,628,239 B2 * | 1/2014 | Merrow | | G11C 29/56 374/4 |
| 9,684,319 B2 * | 6/2017 | Chiu | | G05D 23/1932 |
| 9,756,758 B2 * | 9/2017 | Song | | H05K 7/20 |
| 9,772,664 B1 * | 9/2017 | Chou | | H05K 1/0203 |
| 9,829,203 B2 * | 11/2017 | Yang | | F24D 13/02 |
| 9,900,975 B2 * | 2/2018 | Chen | | G06F 1/206 |
| 10,221,817 B2 * | 3/2019 | Tonkin | | F02M 31/13 |
| 10,887,979 B2 * | 1/2021 | Severson | | H05K 1/0271 |
| 2002/0015286 A1 * | 2/2002 | Wu | | H05K 7/20 361/695 |
| 2005/0092727 A1 * | 5/2005 | Fraley | | G11B 33/128 |
| 2015/0048073 A1 * | 2/2015 | Chiu | | G06F 1/18 219/209 |

(Continued)

FOREIGN PATENT DOCUMENTS

| | | | | |
|---|---|---|---|---|
| EP | 3002563 A1 * | 4/2016 | ........... | B81B 7/0032 |
| WO | WO-2018142064 A1 * | 8/2018 | ........... | B60H 1/2221 |

OTHER PUBLICATIONS

Translation of WO-2018142064-A1 (Year: 2018).*
Translation of EP-3002563-A1 (Year: 2016).*

*Primary Examiner* — Abhishek M Rathod
(74) *Attorney, Agent, or Firm* — Chamberlain, Hrdlicka, White, Williams & Aughtry; Aly Z. Dossa

(57) ABSTRACT

A computing device includes a top cover, a heater apparatus, a plurality of temperature sensors, and a heating control component. The heater apparatus includes a heater component and a connector, and the heater component is affixed to the top cover. The plurality of temperature sensors are operatively connected to the heating control component. The heating control component configured to manage the heater apparatus using the plurality of temperature sensors.

18 Claims, 7 Drawing Sheets

(56) References Cited

U.S. PATENT DOCUMENTS

| | | | |
|---|---|---|---|
| 2020/0127403 A1* | 4/2020 | Sabo | A47B 88/457 |
| 2021/0104787 A1* | 4/2021 | Anderson | H01M 10/6551 |
| 2021/0190372 A1* | 6/2021 | Montanez | F24H 15/31 |

* cited by examiner

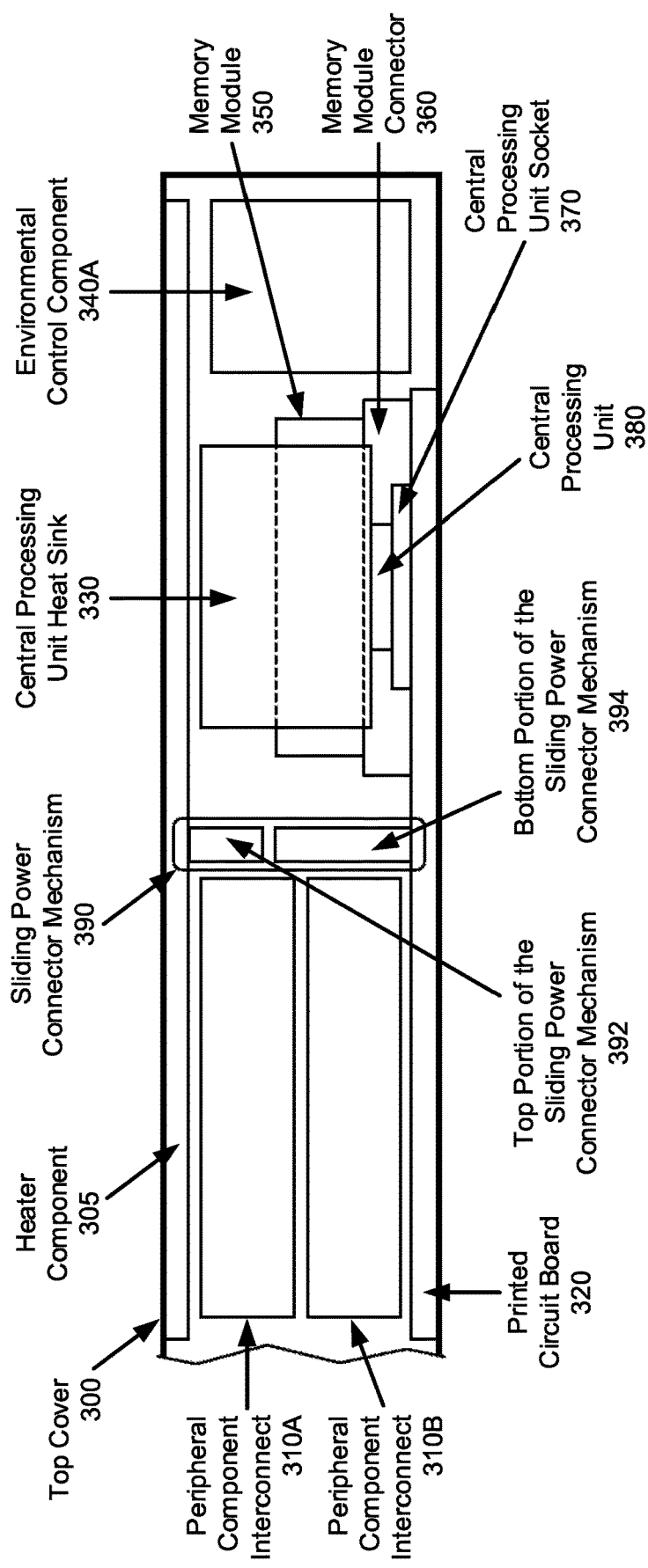
FIG. 3.1

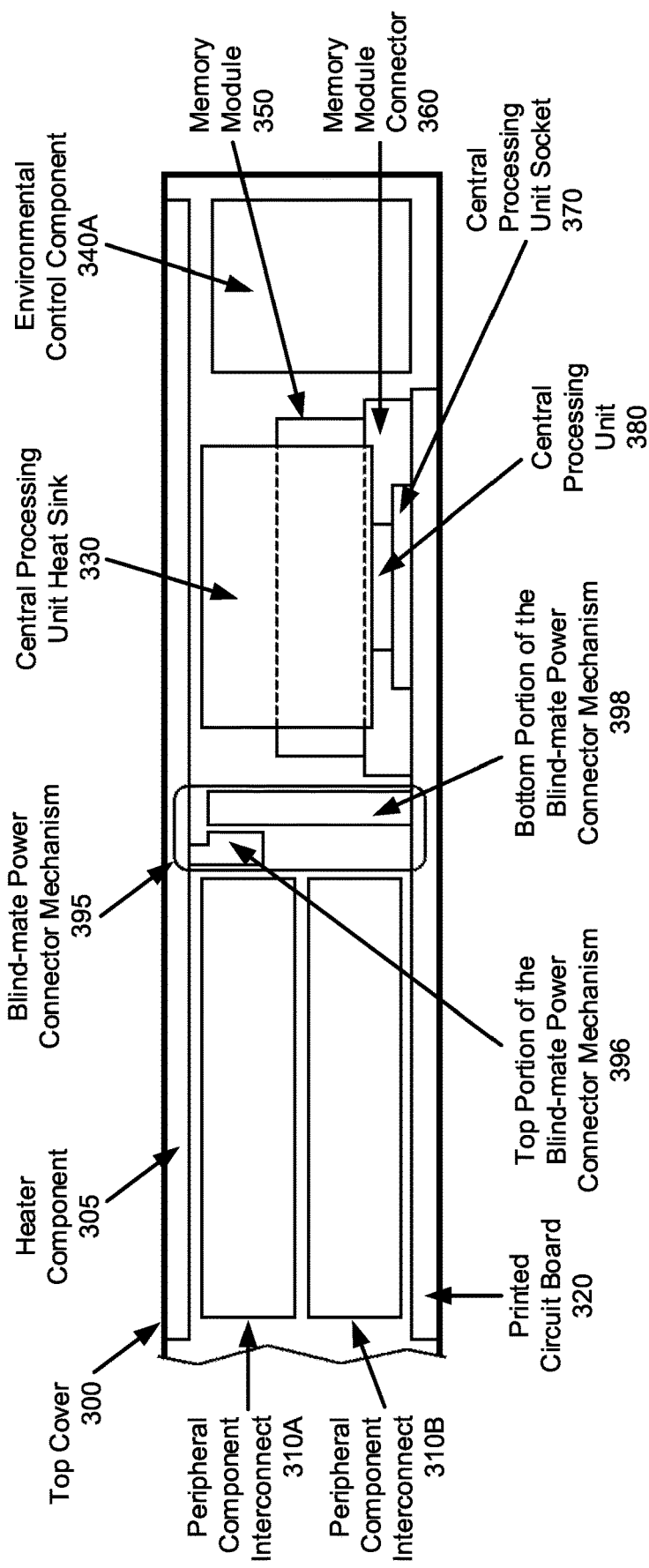
FIG. 3.2

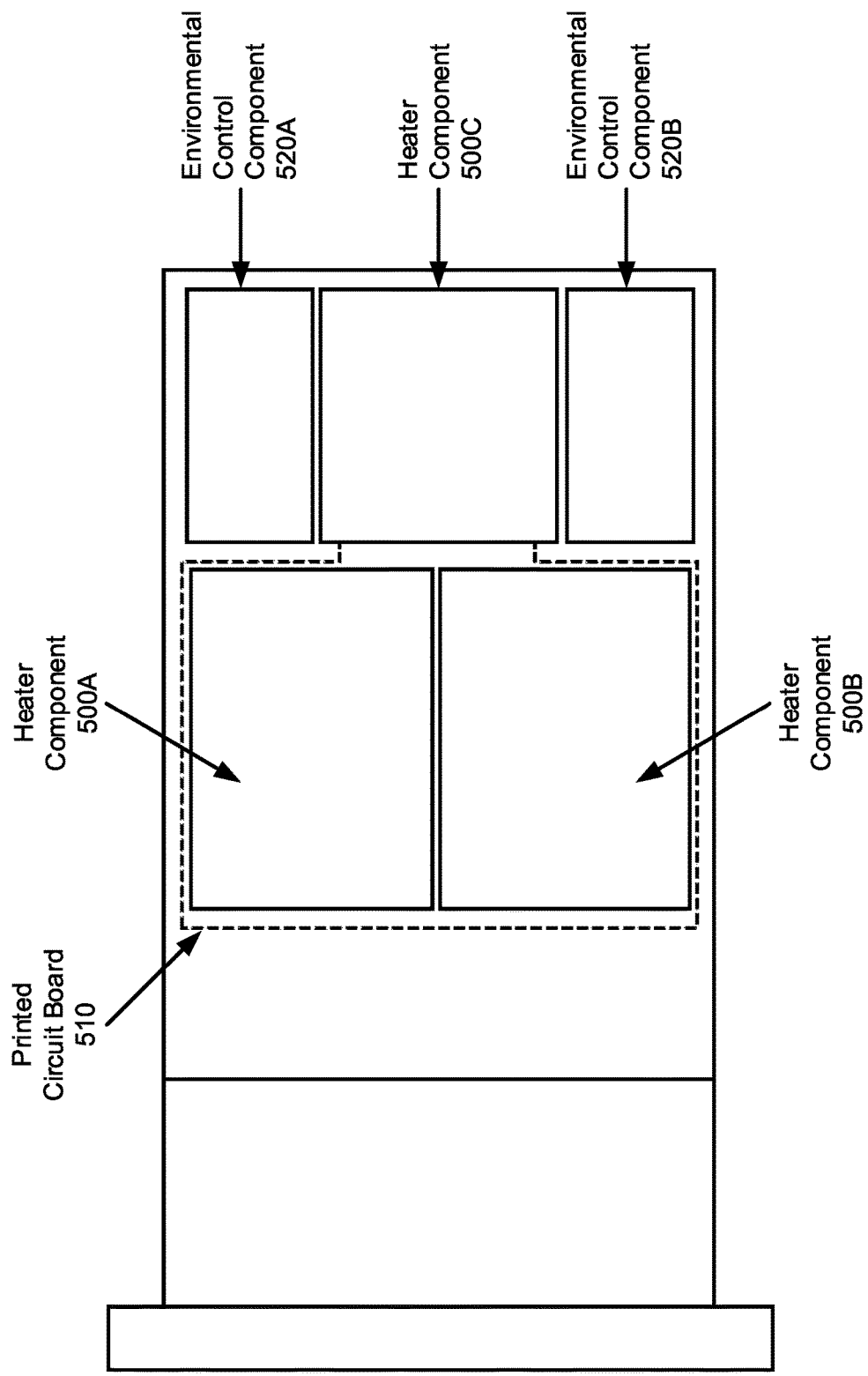
FIG. 5.1

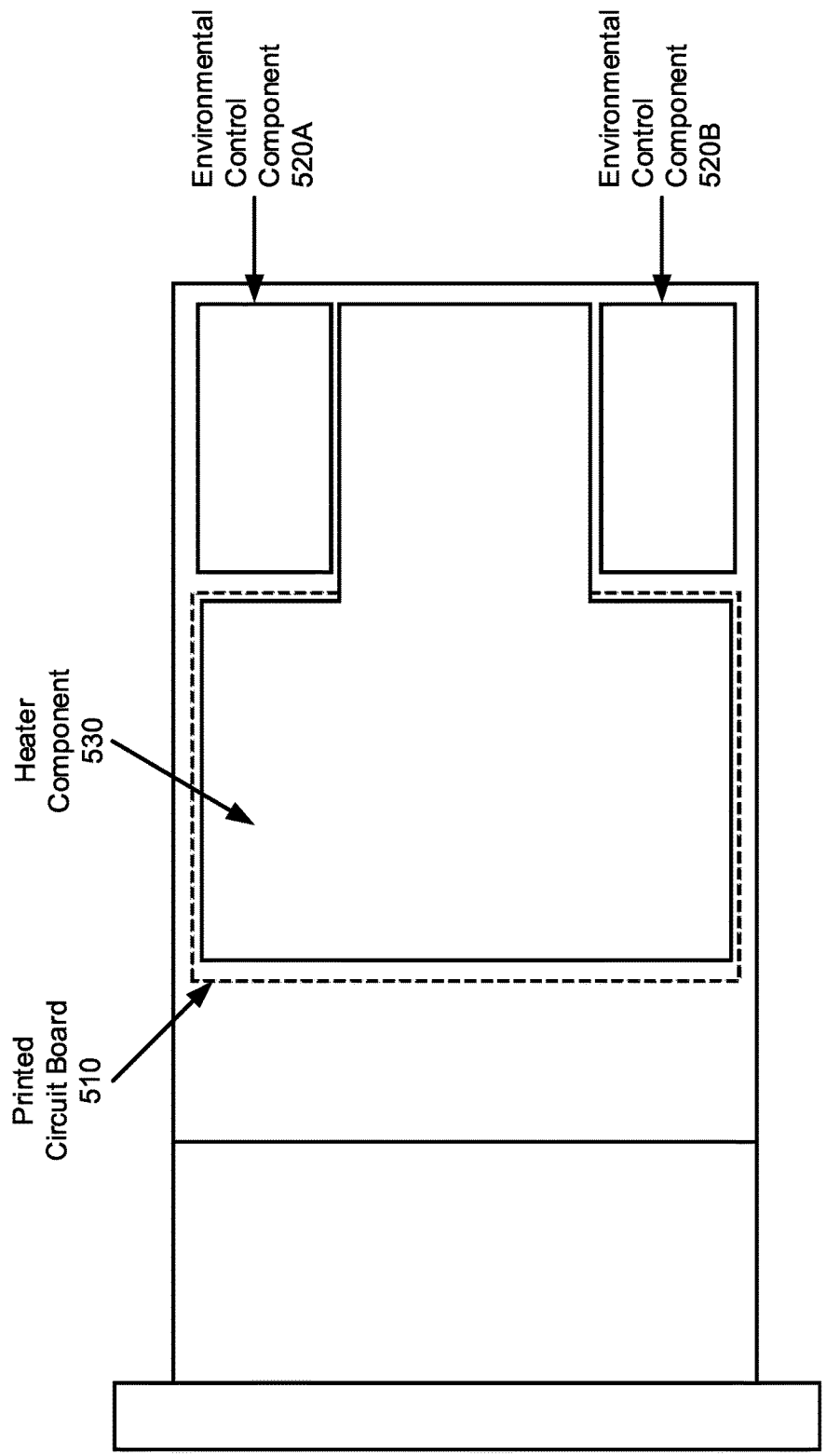
FIG. 5.2

HEATER APPARATUS-INTEGRATED TOP COVER FOR A COMPUTING DEVICE

BACKGROUND

Computing devices may perform services. In order to provide the services, the computing devices may include hardware components and software components. The software components may utilize the hardware components to provide the services.

SUMMARY

In general, in one aspect, the invention relates to a computing device. The computing device includes a top cover, a heater apparatus, a plurality of temperature sensors, and a heating control component. The heater apparatus includes a heater component and a connector, and the heater component is affixed to the top cover. The plurality of temperature sensors are operatively connected to the heating control component. The heating control component configured to manage the heater apparatus using the plurality of temperature sensors.

In general, in one aspect, the invention relates to an information handling system including a cabinet housing a plurality of computing devices. Each computing device includes a top cover, a heater apparatus, a plurality of temperature sensors, and a heating control component. The heater apparatus includes a heater component and a connector, and the heater component is affixed to the top cover. The plurality of temperature sensors are operatively connected to the heating control component. The heating control component configured to manage the heater apparatus using the plurality of temperature sensors.

In general, in one aspect, the invention relates to a method for heating at least one hardware component in a computing device. The method for heating the at least one hardware component in the computing device may include determining a heating condition of the computing device; in response to determination, initiating heating of a hardware component of the computing device using a heater component, and the heater component is affixed to a top cover of the computing device.

BRIEF DESCRIPTION OF DRAWINGS

Certain embodiments of the invention will be described with reference to the accompanying drawings. However, the accompanying drawings illustrate only certain aspects or implementations of the invention by way of example, and are not meant to limit the scope of the claims.

FIG. 3.1 shows a side-view of a portion of a computing device in accordance with one or more embodiments of the invention.

FIG. 3.2 shows a side-view of a portion of a computing device in accordance with one or more embodiments of the invention.

FIG. 5.1 shows a top-view of a computing device in accordance with one or more embodiments of the invention.

FIG. 5.2 shows a top-view of a computing device in accordance with one or more embodiments of the invention.

DETAILED DESCRIPTION

Figure 1:
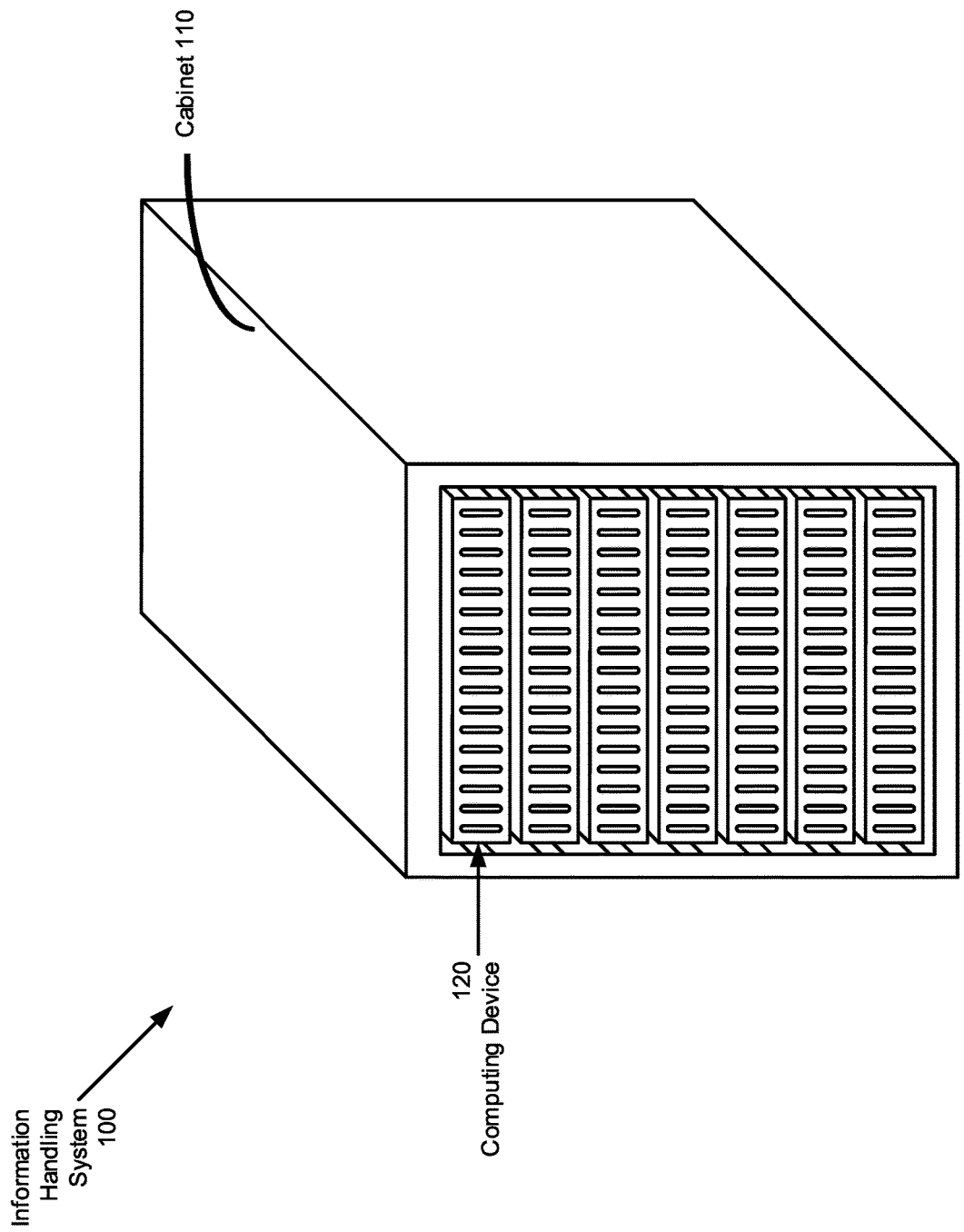
FIG. 1 shows a diagram of an information handling system in accordance with one or more embodiments of the invention.

Specific embodiments will now be described with reference to the accompanying figures. In the following description, numerous details are set forth as examples of the invention. It will be understood by those skilled in the art that one or more embodiments of the present invention may be practiced without these specific details, and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

As used herein, the phrase operatively connected, or operative connection, means that there exists between elements/components/devices a direct or indirect connection that allows the elements to interact with one another in some way. For example, the phrase 'operatively connected' may refer to any direct (e.g., wired directly between two devices or components) or indirect (e.g., wired and/or wireless connections between any number of devices or components connecting the operatively connected devices) connection. Thus, any path through which information and/or power may travel may be considered an operative connection.

Computing devices may include any number of hardware components that facilitate providing the services of the computing devices. The hardware components may include, for example, processors, non-persistent storage drives, persistent storage drives, circuit cards that interconnect these components, etc. In some cases, computing devices might be deployed in environments that result in the temperature of the computing devices being outside of their designed operating range. For example, the computing devices may be designed to operate at temperatures above 0° C. When the computing devices are deployed to harsh environmental conditions (e.g., −40° C. —60° C.), the computing devices may not operate properly and, in certain scenarios, may be damaged.

To address one or more of the aforementioned issues, embodiments of the invention provide a heating mechanism to heat the hardware components to a temperature that is within their designed operating range. More specifically, embodiments of the invention include a heater component(s) that is affixed to the top cover of the computing device. The positioning of the heater component enables targeted heating of at least one hardware component in the computing device, while not taking up valuable space within the computing device.

Various embodiments of the computing device are described below.

FIG. 1 shows a diagram of an information handling system (100) in accordance with one or more embodiments of the invention. The system may include a cabinet (110) and any number of computing devices (e.g., 120).

The cabinet (110) may be a mechanical structure that enables computing devices (e.g., 120) to be positioned with respect to one another. For example, the cabinet (110) may be a rack mountable enclosure that enables the computing devices (e.g., 120) to be disposed within it. The cabinet (110) may be implemented as other types of structures adapted to house, position, orient, and/or otherwise physically, mechanically, electrically, and/or thermally manage the computing devices (e.g., 120). By managing the computing devices (e.g., 120), the cabinet (110) may enable multiple computing devices to be densely packed in a space without negatively impacting the operation of the information handling system (100).

A computing device (e.g., 120) may be a mechanical structure for housing components of the information handling system (100). For example, the computing device (e.g., 120) may be implemented as a rack mountable enclosure for housing components of the information handling system. The computing device (e.g., 120) may be adapted to be disposed within the cabinet (110) and/or utilize services provided by the cabinet (110) and/or other devices.

To provide services, the computing device (e.g., 120) may utilize computing device resources provided by hardware components. The hardware components may include, for example, processors, non-persistent storage drives, a printed circuited board(s), persistent storage drives, special purpose hardware, and/or other types of physical components that contribute to the operation of the computing device.

Figure 2:
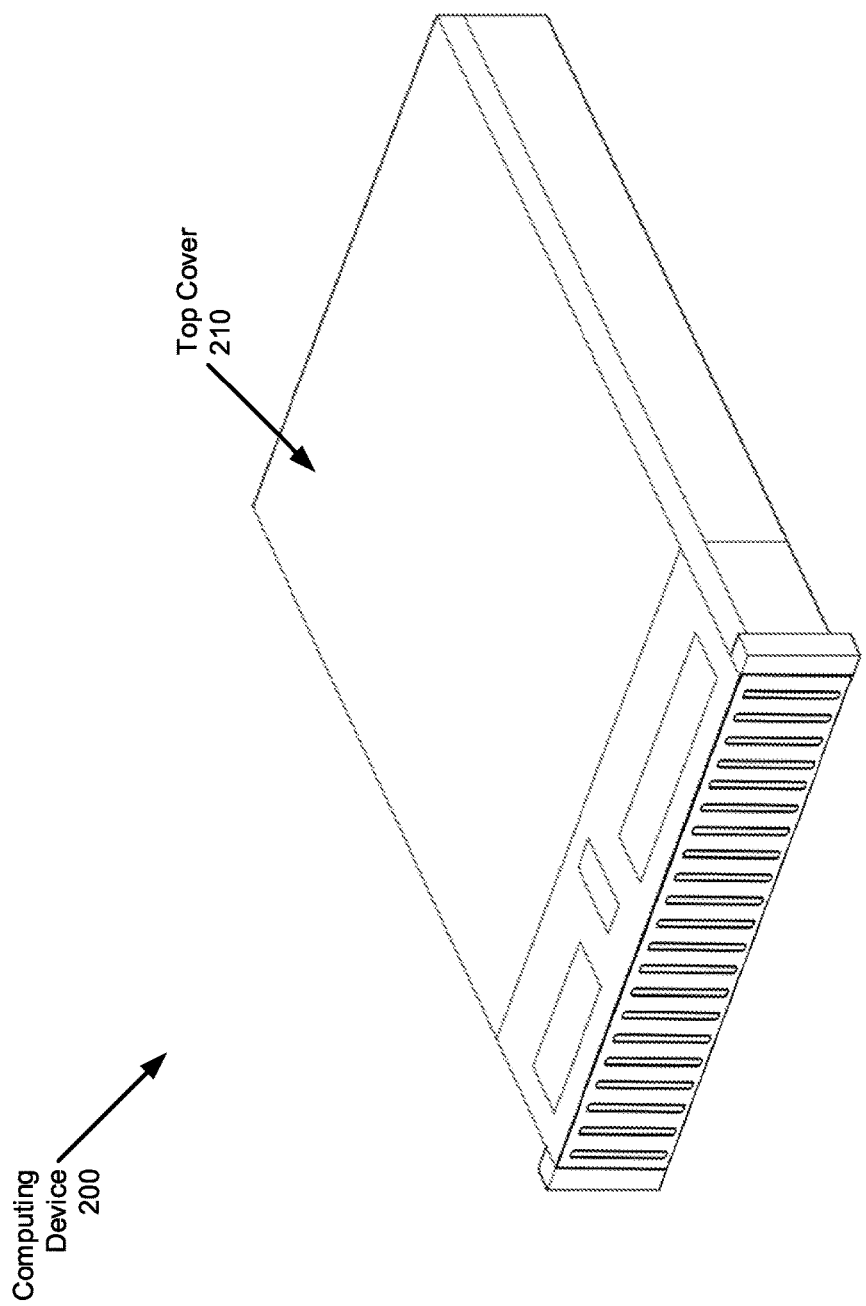
FIG. 2 shows a diagram of a computing device in accordance with one or more embodiments of the invention.

Turning now to FIG. 2, FIG. 2 shows a diagram of a computing device (200) in accordance with one or more embodiments of the invention. In one or more embodiments of the invention, the computing device includes six sides (i.e., top, bottom, right, left, front, and back) and a heater component (not shown) that is affixed to a top cover (i.e., topside of the computing device) to bring the hardware components of the computing device into an appropriate operating temperature range (e.g., above 0° C.) when necessary. A heater-component integrated top cover may improve stability and functionality of the computing device as it provides computer-implemented services in harsh environmental conditions. To provide services, the computing device (200) may utilize computing device resources provided by a number of hardware components housed within the computing device.

The number of hardware components may include, for example, persistent storage drives (not shown), non-persistent storage drives (not shown), processors (not shown), peripheral component interconnects (not shown), a printed circuit board (not shown), and/or other types of physical components that contribute to the operation of the computing device (200). Some examples of the hardware components are shown in FIGS. 3.1 and 3.2, but the examples of the hardware components are not limited to those shown in FIGS. 3.1 and 3.2. In other embodiments, one or more of the hardware components may be omitted or additional hardware components may be added based on the services provided by the computing device.

In one or more embodiments of the invention, the computing device (200) includes a printed circuit board (not shown), a top cover (210), a heating control component (not shown), a number of environmental control components (not shown), a number of printed circuit board components (not shown), and a heater apparatus (not shown) that includes a heater component (not shown) and a connector (not shown).

While described as a physical structure, the heating control component (not shown) may be implemented as a logical entity (e.g., a program executing using the number of printed circuit board components (not shown)). For example, the computing device (200) may host a program that provides the functionality of the heating control component (not shown).

FIGS. 3.1 and 3.2 show different connector mechanisms of a heater apparatus in accordance with one or more embodiments disclosed below.

Turning now to FIG. 3.1, FIG. 3.1 shows a side-view of a portion of a computing device in accordance with one or more embodiments of the invention. In one or more embodiments of the invention, the side-view of the portion of the computing device includes a top cover (300), a heater component (305), a number of peripheral component interconnects (e.g., 310A, 310B, etc.), a printed circuit board (320), a central processing unit heat sink (330), a number of environmental control components (e.g., 340A), a memory module (350), a memory module connector (360), a central processing unit socket (370), a central processing unit (380), a sliding power connector mechanism (390), in which the sliding power connector mechanism (390) includes a top portion (392) and a bottom portion (394). The top portion of the sliding power connector mechanism (392) is operatively connected to the heater component (305) and the bottom portion of the sliding power connector mechanism (394) is operatively connected to the printed circuit board (320), where the printed circuit board provides the required power to the heater component to initiate the heating process.

Those skilled in the art will appreciate that while the central processing unit heat sink (330), the memory module (350), the memory module connector (360), the central processing unit socket (370), the central processing unit (380), and the number of environmental control components (e.g., 340A) are shown that they are located at the backside of the computing device, those components may be placed at any location within the computing device without departing from the invention.

In one or more embodiments of the invention, the number of environmental control components (e.g., 340A) may include physical devices that provide functionality to alter characteristics (e.g., airflow directions, humidity and temperature levels, etc.) of the internal environment of the computing device (e.g., 200, FIG. 2) at a macroscopic level. For example, the number of environmental control components (e.g., 340A) may include gas movers such as fans. The fans may be able to change a rate of gases drawn into and expelled from the computing device.

In one or more embodiments of the invention, the heater component (305) is made of silicon rubber, any other material, and/or any combination thereof that enables the heater component to perform the functions described herein. The heater component has sufficient thickness and compliance such that it sufficiently conforms to the top cover (300).

Turning now to FIG. 3.2, FIG. 3.2 shows a side-view of a portion of a computing device in accordance with one or more embodiments of the invention. In another embodiment of the invention shown in FIG. 3.2, the sliding power connector mechanism is replaced with a blind-mate power connector mechanism (395), in which the blind-mate power connector mechanism (395) includes a top portion (396) and a bottom portion (398). The top portion of the blind-mate power connector mechanism (396) is operatively connected to the heater component (305) and the bottom portion of the blind-mate power connector mechanism (398) is operatively connected to the printed circuit board (320), where the printed circuit board provides the required power to the heater component to initiate the heating process.

While FIGS. 3.1 and 3.2 show a set of power connector mechanisms, any configuration of power connector mechanisms at any location within the computing device maybe used to provide the required power to the heater component to initiate the heating process without departing from the invention. Those skilled in the art will appreciate that the heater component (305) may be supplied with power, directly or indirectly (e.g., via the heating control component, the printed circuit board, etc.), via one or more power supplies (not shown) within the computing device.

Figure 4:
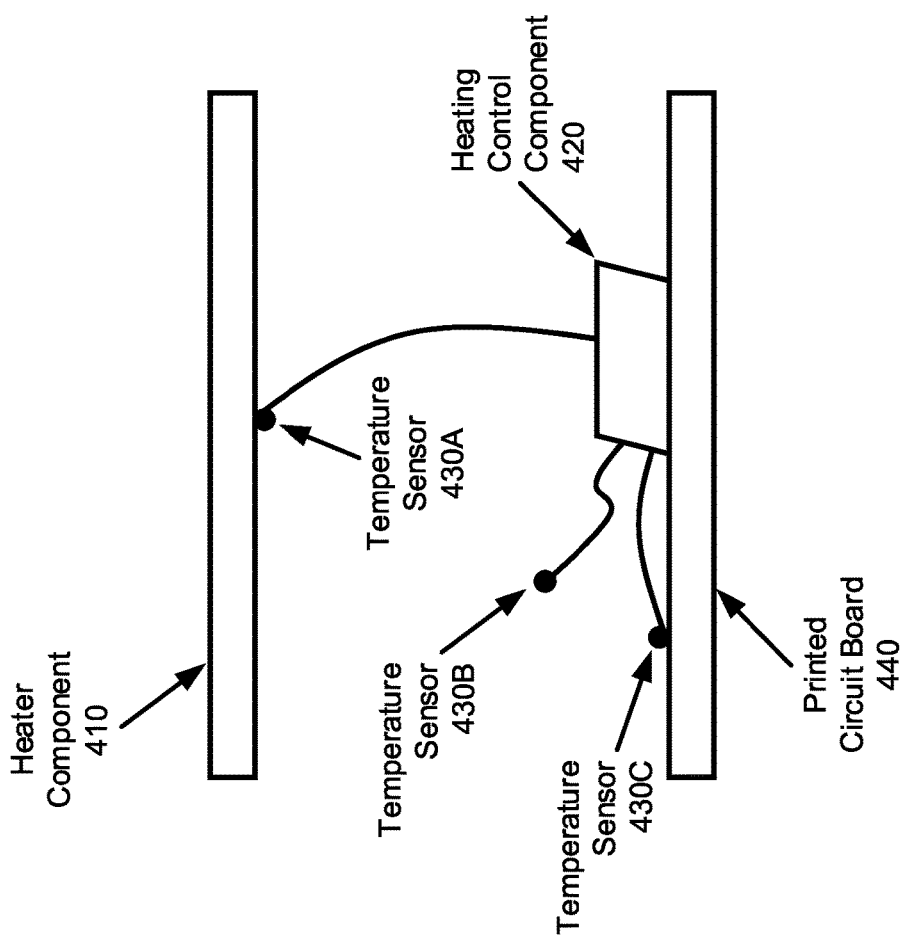
FIG. 4 shows a side-view of a portion of a computing device in accordance with one or more embodiments of the invention.

Turning now to FIG. 4, FIG. 4 shows a side-view of a portion of a computing device in accordance with one or more embodiments of the invention. In one or more embodiments of the invention, the side-view of the portion of the computing device includes a heater component (410), a heating control component (420), a number of temperature sensors (e.g., 430A, 430B, 430C, etc.), and a printed circuit board (440). One end of the number of temperature sensors (e.g., 430A, 430B, 430C, etc.) is operatively connected to the heating control component (420), while the other end of the number of temperature sensors is operatively connected to at least one of the hardware components (e.g., heater component (410), printed circuit board (440), etc.) within the computing device (e.g., 200, FIG. 2).

In one or more embodiments of the invention, the heating control component (420) may provide heating control services. The heating control services may include (i) obtaining information regarding the temperature of one or more hardware components within the computing device (e.g., 200, FIG. 2) (also referred to as obtaining the environmental condition of the computing device), where the information may be obtained through the number of temperature sensors in the computing device, (ii) determining whether the temperature within the computing device is below the appropriate operating temperature range (e.g., whether the temperature is below 0° C.), (iii) initiating a heating process to bring the hardware components of the computing device into their designed operating temperature, and (iv) preventing damage (e.g., thermal runaway) to the heater component in the event of overheating.

Those skilled in the art will appreciate that while the heating control component (420) is shown that it is located on top of the printed circuit board (440), it may be placed at any location within the computing device without departing from the invention.

FIGS. 5.1 and 5.2 show the compatibility of one or more embodiments of the invention below.

Turning now to FIG. 5.1, FIG. 5.1 shows a top-view of a computing device in accordance with one or more embodiments of the invention. In one or more embodiments of the invention, the top-view of the computing device includes a printed circuit board (510, shown with dash lines), a number of heater apparatuses that include a number of custom-sized heater components (e.g., 500A, 500B, 500C) and a number of connectors (not shown), and a number of environmental control components (e.g., 520A, 520B, etc.), as described throughout the application.

In one or more embodiments of the invention, the custom-sized heater components (e.g., 500A, 500B, 500C, 500D) are affixed to a top cover (excluded from FIG. 5.1 for visibility). The custom-sized heater components are aligned with the top cover. While FIG. 5.1 shows the custom-sized heater components are mostly overlapping with the printed circuit board, there may be embodiments that the custom-sized heater components may extend the edges of the printed circuit board, where the total area of the custom-sized heater components are still less than the area of the top cover.

In one or more embodiments of the invention, the custom-sized heater components (e.g., 500A, 500B, 500C, 500D) may be organized such that they can be excluded from an area of the computing device that does not require heating. Further, they can provide the ability of selective heating of at least one hardware component in the computing device to maximize heating process efficiency. For example, a particular area of the computing device may require a higher temperature increase as compared to other areas of the computing device. To bring at least one hardware component in the computing device located in this particular area into its operating temperature in a short period of time, more power can be applied to one or more custom-sized heater components that are close to the particular area to make those custom-sized heaters hotter than the remaining custom-sized heaters.

Turning now to FIG. 5.2, FIG. 5.2 shows a top-view of a computing device in accordance with one or more embodiments of the invention. In one or more embodiments of the invention, the top-view of the computing device includes a printed circuit board (510, shown with dash lines), a heater apparatus that includes a heater component (530) and a connector (not shown), and a number of environmental control components (e.g., 520A, 520B, etc.), as described throughout the application.

In one or more embodiments of the invention, the heater component (530) is affixed to a top cover (excluded from FIG. 5.2 for visibility). The heater component has a monolithic shape that is aligned with the top cover. While FIG. 5.2 shows the heater component is mostly overlapping with the printed circuit board, there may be embodiments that the heater component may extend the edges of the printed circuit board, where the area of the heater component is still less than the area of the top cover. In one or more embodiments of the invention, the monolithic shape of the heater component (530) provides uniform heating of hardware components in the computing device located underneath the heater component as a result of the applied power. By this way, the hardware components in the computing device located underneath the heater component will be heated up to their corresponding operating temperature approximately at the same time, depending on a temperature gradient of the heater component.

The problems discussed above should be understood as being examples of problems solved by embodiments of the invention disclosed herein and the invention should not be limited to solving the same/similar problems. The disclosed invention is broadly applicable to address a range of problems beyond those discussed herein.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A computing device, comprising:
   a top cover;
   a heater apparatus, wherein the heater apparatus comprises a heater component and a connector, wherein the heater component is affixed to the top cover,
      wherein the connector comprises a top portion and a bottom portion,
      wherein the top portion is operatively connected to the heater component and the bottom portion is operatively connected to a printed circuit board to activate the heater component;
   a plurality of temperature sensors,
      wherein a first end of a first temperature sensor of the plurality of temperature sensors is operatively connected to a heating control component and a second end of the first temperature sensor is operatively connected to the heater component,
      wherein a first end of a second temperature sensor of the plurality of temperature sensors is operatively connected to the heating control component and a second end of the second temperature sensor is operatively connected to an environmental control component; and
   the heating control component configured to manage the heater apparatus using the plurality of temperature sensors and to obtain information with respect to a temperature of a processor via a third temperature sensor of the plurality of temperature sensors to prevent overheating of the processor.

2. The computing device of claim 1, further comprising: the printed circuit board, wherein a first end of the connector is affixed to the heater component and a second end of the connector is affixed to the printed circuit board.

3. The computing device of claim 2, wherein the heating control component is affixed to the printed circuit board.

4. The computing device of claim 1, wherein the heater component is configured to heat at least one hardware component in the computing device.

5. The computing device of claim 4, wherein the at least one hardware component is mounted on the printed circuit board.

6. The computing device of claim 1, wherein the heater apparatus further comprises:
   a second heater component; and
   a second connector, wherein a first end of the second connector is affixed to the second heater component and a second end of the second connector is affixed to the printed circuit board.

7. The computing device of claim 6, wherein the heater component and the second heater component operate independently.

8. The computing device of claim 6, wherein the second heater component is affixed to the top cover.

9. The computing device of claim 1, wherein the heater component is a silicon rubber heater.

10. The computing device of claim 1, wherein an area of the heater component is less than an area of the top cover.

11. The computing device of claim 1, wherein the connector is a sliding power connector or a blind-mate power connector.

12. An information handling system, comprising:
    a cabinet housing a plurality of computing devices;
    the plurality of computing devices, wherein each of the computing devices comprises:
       a top cover;
       a heater apparatus, wherein the heater apparatus comprises a heater component and a connector, wherein the heater component is affixed to the top cover,
          wherein the connector comprises a top portion and a bottom portion,
          wherein the top portion is operatively connected to the heater component and the bottom portion is operatively connected to a printed circuit board to activate the heater component;
       a plurality of temperature sensors,
          wherein a first end of a first temperature sensor of the plurality of temperature sensors is operatively connected to a heating control component and a second end of the first temperature sensor is operatively connected to the heater component,
          wherein a first end of a second temperature sensor of the plurality of temperature sensors is operatively connected to the heating control component and a second end of the second temperature sensor is operatively connected to an environmental control component; and
       the heating control component configured to manage the heater apparatus using the plurality of temperature sensors and to obtain information with respect to a temperature of a processor via a third temperature sensor of the plurality of temperature sensors to prevent overheating of the processor.

13. The information handling system of claim 12, wherein each of the computing devices further comprises:
    the printed circuit board, wherein a first end of the connector is affixed to the heater component and a second end of the connector is affixed to the printed circuit board.

14. The information handling system of claim 13, wherein the heating control component is affixed to the printed circuit board.

15. The information handling system of claim 12, wherein the heater component is configured to heat at least one hardware component in the corresponding computing device.

16. The information handling system of claim 15, wherein the at least one hardware component is mounted on the printed circuit board in the corresponding computing device.

17. The information handling system of claim 12, wherein the heater apparatus further comprises:
    a second heater component; and
    a second connector, wherein first end of the second connector is affixed to the second heater component and second end of the second connector is affixed to the printed circuit board.

18. The information handling system of claim 17, wherein the heater component and the second heater component operate independently.

* * * * *